US012598860B2

(12) United States Patent
Asaoka et al.

(10) Patent No.: US 12,598,860 B2
(45) Date of Patent: Apr. 7, 2026

(54) LIGHT-EMITTING DEVICE

(71) Applicant: SHARP KABUSHIKI KAISHA, Sakai City (JP)

(72) Inventors: Yasushi Asaoka, Sakai City (JP); Jun Sakuma, Sakai City (JP); Takahiro Adachi, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 557 days.

(21) Appl. No.: 18/014,637

(22) PCT Filed: Jul. 22, 2020

(86) PCT No.: PCT/JP2020/028447
§ 371 (c)(1),
(2) Date: Jan. 5, 2023

(87) PCT Pub. No.: WO2022/018858
PCT Pub. Date: Jan. 27, 2022

(65) Prior Publication Data
US 2023/0276645 A1      Aug. 31, 2023

(51) Int. Cl.
*H10K 50/13*        (2023.01)
*H10K 50/16*        (2023.01)
*H10K 50/18*        (2023.01)

(52) U.S. Cl.
CPC ........... *H10K 50/131* (2023.02); *H10K 50/13* (2023.02); *H10K 50/166* (2023.02); *H10K 50/181* (2023.02); *H10K 50/18* (2023.02)

(58) Field of Classification Search
CPC .... H10K 50/131; H10K 50/13; H10K 50/166; H10K 50/181; H10K 50/18; H10K 50/16; H10K 2101/30; H10K 2101/40; H10K 59/32; H05B 33/12; H05B 33/14
See application file for complete search history.

(56) References Cited

U.S. PATENT DOCUMENTS

| | | | |
|---|---|---|---|
| 6,224,966 B1 * | 5/2001 | Sakai ...................... | H10K 50/11 313/506 |
| 2005/0040392 A1 * | 2/2005 | Wu ........................ | H10K 50/87 257/40 |
| 2013/0069036 A1 | 3/2013 | Miyata | |

(Continued)

FOREIGN PATENT DOCUMENTS

WO        2011148791 A1     12/2011

*Primary Examiner* — Jacob Y Choi
*Assistant Examiner* — Ashley Nicole Blackwell
(74) *Attorney, Agent, or Firm* — ScienBiziP, P.C.

(57)        ABSTRACT

A light-emitting device includes a first light-emitting layer disposed between a cathode and an anode and having a light emission central wavelength being a first wavelength; a second light-emitting layer disposed between the anode and the first light-emitting layer, having a light emission central wavelength being a second wavelength shorter than the first wavelength, and having an electron affinity lower than an electron affinity of the first light-emitting layer; and a first electron transport layer disposed between the first light-emitting layer and the second light-emitting layer in the second light-emitting region and having magnitude of an electron affinity between an electron affinity of the first light-emitting layer and an electron affinity of the second light-emitting layer.

17 Claims, 8 Drawing Sheets

100B

(56) References Cited

U.S. PATENT DOCUMENTS

| | | | |
|---|---|---|---|
| 2014/0353635 A1* | 12/2014 | Chou | H10K 59/876 |
| | | | 257/40 |
| 2016/0163772 A1* | 6/2016 | Wu | H10K 50/852 |
| | | | 257/40 |
| 2018/0151630 A1* | 5/2018 | Yamaoka | H10K 59/876 |
| 2022/0158115 A1* | 5/2022 | Naka | G09F 9/30 |

* cited by examiner

LIGHT-EMITTING DEVICE

TECHNICAL FIELD

The disclosure relates to a light-emitting device.

BACKGROUND ART

For example, WO 2011/148791 discloses a light-emitting device in which an anode, a first light-emitting layer, a second light-emitting layer, and a cathode are layered in this order. Then, a part of the first light-emitting layer is processed and brought into a non-light-emitting state, and thus the first light-emitting layer is divided into a light-emitting region and a non-light-emitting region.

SUMMARY

Technical Problem

The light-emitting device described in WO 2011/148791 has a structure in which the non-light-emitting region of the first light-emitting layer and the second light-emitting layer are layered, and when a hole supplied from the anode reaches the second light-emitting layer via the non-light-emitting region of the first light-emitting layer, light is emitted in the second light-emitting layer. In the light-emitting device described above, the non-light-emitting region of the first light-emitting layer may block the hole reaching the second light-emitting layer, and luminous efficiency may decrease.

A main object of the present disclosure is to provide a light-emitting device in which a decrease in luminous efficiency can be suppressed, for example.

Solution to Problem

A light-emitting device according to one aspect of the disclosure includes a first light-emitting region in which a light emission central wavelength is a first wavelength; a second light-emitting region in which a light emission central wavelength is a second wavelength shorter than the first wavelength; a cathode disposed in the first light-emitting region and the second light-emitting region; an anode facing the cathode in the first light-emitting region and the second light-emitting region; a first light-emitting layer disposed between the cathode and the anode and having a light emission central wavelength being the first wavelength; a second light-emitting layer disposed between the anode and the first light-emitting layer at least in the second light-emitting region, having a light emission central wavelength being the second wavelength, and having an electron affinity lower than an electron affinity of the first light-emitting layer; and a first electron transport layer disposed between the first light-emitting layer and the second light-emitting layer in the second light-emitting region and having magnitude of an electron affinity between an electron affinity of the first light-emitting layer and an electron affinity of the second light-emitting layer.

DESCRIPTION OF EMBODIMENTS

Preferable embodiments for carrying out the disclosure will be described hereinafter. However, the following embodiments are merely illustrative. The disclosure is not limited in any way to the following embodiments.

First Embodiment

Figure 1:
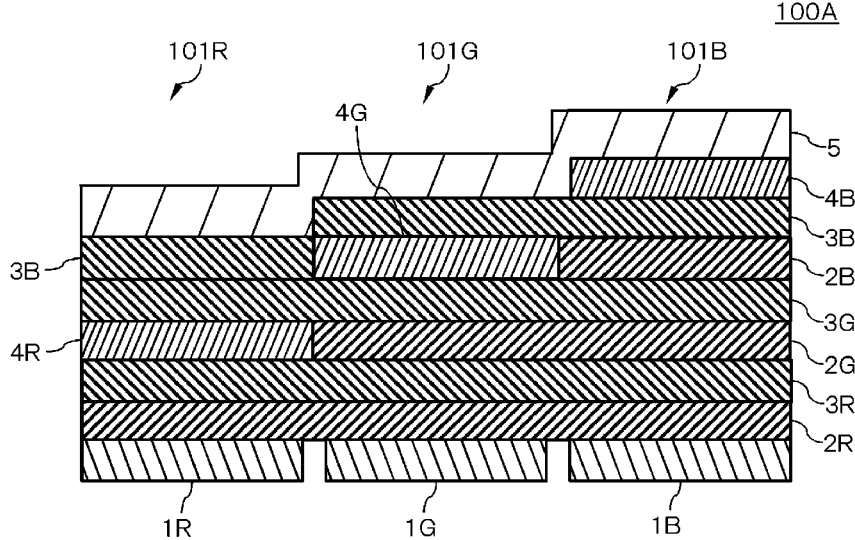
FIG. 1 is a diagram schematically illustrating an example of a layered structure of a light-emitting device according to a first embodiment.

FIG. 1 is a diagram schematically illustrating an example of a layered structure of a light-emitting device 100A according to the present embodiment.

The light-emitting device 100A is a device that emits light. For example, the light-emitting device 100A may be an illumination device (for example, a backlight or the like) that emits light such as white light, or may be a display device that displays an image (including, for example, character information) by emitting light. In the present embodiment, an example in which the light-emitting device 100A is one pixel in a display device will be described. For example, a display device can be formed by arranging a plurality of pixels in a matrix.

As illustrated in FIG. 1, the light-emitting device 100A includes, for example, a red light-emitting region (first light-emitting region) 101R, a green light-emitting region (second light-emitting region) 101G, and a blue light-emitting region (third light-emitting region) 101B. The red light-emitting region 101R has a light emission central wavelength being a first wavelength, and emits light at, for example, approximately 630 nm. The green light-emitting region 101G has a light emission central wavelength being a second wavelength of, for example, approximately 530 nm shorter than the first wavelength. The blue light-emitting region 101B has a light emission central wavelength being a third wavelength of, for example, approximately 440 nm shorter than the second wavelength.

The red light-emitting region 101R is a region that emits red light in the light-emitting device 100A. The red light-emitting region 101R corresponds to, for example, a red light-emitting element in the light-emitting device 100A. The red light-emitting region 101R has a structure in which a cathode 1R, a second electron transport layer 2R, a first light-emitting layer 3R, a first electron blocking layer 4R, a second light-emitting layer 3G, a third light-emitting layer 3B, and an anode 5 are layered in this order. In other words, the red light-emitting region 101R has a structure in which each of the layers is disposed between the cathode 1R and the anode 5 disposed so as to face the cathode 1R.

For example, the cathode 1R injects an electron into the first light-emitting layer 3R.

For example, the anode 5 injects a hole into the first light-emitting layer 3R.

The cathode 1R and the anode 5 are formed of, for example, a conductive material such as a metal, a transparent conductive oxide, and a conductive nanomaterial. Examples of the metal described above include Al, Cu, Au, Ag, an alloy such as MgAg, and the like. Examples of the transparent conductive oxide described above include indium tin oxide (ITO), indium zinc oxide (IZO), zinc oxide (ZnO), aluminum zinc oxide (ZnO:Al(AZO)), boron zinc oxide (ZnO:B(BZO)), and the like. Examples of the conductive nanomaterial include an Ag nanowire, a carbon nanotube, an ITO nanoparticle, and the like. Note that the cathode 1R and the anode 5 may be, for example, a layered body including at least one metal layer and/or at least one transparent conductive oxide layer.

Figure 6:
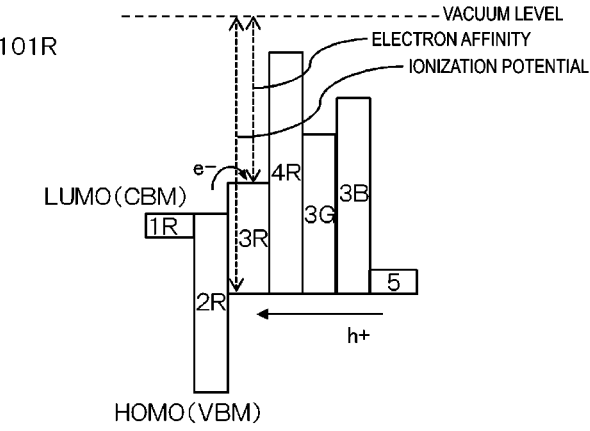
FIG. 6 is an energy level diagram of an example of each layer in a red light-emitting region of the light-emitting device according to the first embodiment.

The first light-emitting layer 3R is disposed between the cathode 1R and the anode 5. The first light-emitting layer 3R has a light emission central wavelength being the first wavelength, and emits light at, for example, approximately 630 nm. For example, the first light-emitting layer 3R includes a first light-emitting material that has a light emission central wavelength being the first wavelength and emits light at, for example, approximately 630 nm. The first light-emitting material emits light by, for example, recombination of an injected electron and an injected hole. In other words, it can be said that the first light-emitting layer 3R emits light by, for example, the recombination of the injected electron and the injected hole. Note that, a hole (h+) is injected into the first light-emitting layer 3R in the present embodiment from the anode 5 via the third light-emitting layer 3B, the second light-emitting layer 3G, and the first electron blocking layer 4R as illustrated in FIG. 6, for example. Meanwhile, an electron (e−) is injected into the first light-emitting layer 3R in the present embodiment from the cathode 1R via the second electron transport layer 2R as illustrated in FIG. 6, for example. Further, the light emission central wavelength described above represents, for example, a light emission peak in a light-emitting layer. Furthermore, as illustrated in FIG. 6, an electron affinity in the first light-emitting layer 3R has magnitude needed for extracting an electron, to a vacuum level, from an energy level of LUMO when the first light-emitting layer 3R is an organic material or an energy level of CBM when the first light-emitting layer 3R is an inorganic crystal material. Further, an ionization potential in the first light-emitting layer 3R has magnitude needed for extracting an electron, to a vacuum level, from an energy level of HOMO when the first light-emitting layer 3R is an organic material, or an energy level of VBM when the first light-emitting layer 3R is an inorganic crystal material. The ionization potential in the first light-emitting layer 3R corresponds to a value obtained by adding a band gap to the electron affinity. Here, the first light-emitting layer 3R has been described, but the same applies to the other layers.

Examples of the first light-emitting material include quantum dots and the like. For example, the quantum dot is a semiconductor fine particle having a particle size of equal to or less than 100 nm, and can include a crystal of a group II-VI semiconductor compound such as MgS, MgSe, MgTe, MgZnS, MgZnSe, CaS, CaSe, CaTe, SrS, SrSe, SrTe, BaS, BaSe, BaTe, ZnS, ZnSe, ZnTe, ZnSSe, ZnTeS, ZnTeSe, CdS, CdSe, CdSSe, CdTe, CdSeTe, CdZnSe, CdZnTe, HgS, HgSe, and HgTe, and/or a crystal of a group III-V semiconductor compound such as GaAs, GaP, InN, InAs, InP, and InSb, and/or a crystal of a group IV semiconductor compound such as Si and Ge. Further, the quantum dot may have, for example, a core/shell structure in which the semiconductor crystal described above is a core and the core is overcoated with a shell material having a high band gap. Furthermore, the quantum dot may have a perovskite structure such as $APbX_3$ [A=Cs, methylammonium (MA), formamidinium (FA), X=Cl, Br, I] and $(CH_3NH_3)_3Bi_2X_9$.

The second electron transport layer 2R is disposed between the cathode 1R and the first light-emitting layer 3R. The second electron transport layer 2R transports, to the first light-emitting layer 3R, the electron injected from the cathode 1R.

The second electron transport layer 2R preferably has an energy level of a lowest unoccupied molecular orbital (LUMO) lower than an energy level of LUMO of the first light-emitting layer 3R. In this case, for example, as illustrated in FIG. 6, the electron injected from the cathode 1R can be easily transported to the first light-emitting layer 3R via the second electron transport layer 2R.

Furthermore, the second electron transport layer 2R preferably has an energy level of a highest occupied molecular orbital (HOMO) lower than an energy level of HOMO of the first light-emitting layer 3R. In this case, for example, as illustrated in FIG. 6, the hole injected from the anode 5 via the third light-emitting layer 3, the second light-emitting layer 3G, and the first electron blocking layer 4R can be confined in the first light-emitting layer 3R, and luminous efficiency in the red light-emitting region 101R can be improved.

For example, an electron transport material such as zinc oxide (for example, ZnO), titanium oxide (for example, $TiO_2$), strontium oxide titanium (for example, $SrTiO_3$), $In_2O_3$, CdS, LZO, SiTe, SiSe, SiS, and a fullerene derivative is used as a material forming the second electron transport layer 2R. One type of these electron transport materials may be used, or two or more types thereof may be mixed and used as appropriate. Note that the material forming the second electron transport layer 2R is selected as appropriate in accordance with an energy level of HOMO and an energy level of LUMO of each of the layers.

The first electron blocking layer 4R is disposed between the first light-emitting layer 3R and the second light-emitting layer 3G. The first electron blocking layer 4R blocks injection, into the second light-emitting layer 3G side, of the electron injected from the cathode 1R.

Furthermore, the first electron blocking layer 4R preferably has an energy level of LUMO higher than the energy level of LUMO of the first light-emitting layer 3R. In this case, for example, as illustrated in FIG. 6, the injection, into the second light-emitting layer 3G side, of the electron injected form the cathode 1R via the first light-emitting layer 3R can be more easily blocked. Furthermore, the electron injected into the first light-emitting layer 3R can be confined in the first light-emitting layer 3R, and thus luminous efficiency in the red light-emitting region 101R can be improved.

The first electron blocking layer 4R preferably has an energy level of HOMO equal to or higher than the energy level of HOMO of the first light-emitting layer 3R. In this case, for example, as illustrated in FIG. 6, the hole injected from the anode 5 can be more easily injected into the first light-emitting layer 3R.

Examples of a material forming the first electron blocking layer 4R include a material including one or more types selected from the group consisting of an oxide, a nitride, or a carbide including any one or more of Zn, Cr, Ni, Ti, Nb, Al, Si, Mg, Ta, Hf, Zr, Y, La, and Sr, a material such as 4,4',4"-tris(9-carbazoyl)triphenylamine (TCTA), 4,4'-bis[N-(1-naphthyl)-N-phenyl-amino]-biphenyl (NPB), zincphthalocyanine (ZnPC), di[4-(N,N-ditolylamino)phenyl]cyclohexane (TAPC), 4,4'-bis(carbazol-9-yl)biphenyl (CBP), 2,3,6,7,10,11-hexacyano-1,4,5,8,9,12-hexaazatriphenylene (HATCN), and $MoO_3$, a hole transport organic material such as poly(N-vinylcarbazole) (PVK), poly(2,7-(9,9-di-n-octylfluorene)-(1,4-phenylene-((4-sec-butylphenyl)imino)-1,4-phenylene)) (TFB), a poly(triphenylamine) derivative (Poly-TPD), and poly(3,4-ethylenedioxythiophene)/poly(4-styrenesulfonic acid) (PEDOT-PSS), and the like. Note that the material forming the first electron blocking layer 4R is selected as appropriate in accordance with an energy level of HOMO and an energy level of LUMO of each of the layers.

The second light-emitting layer 3G has a light emission central wavelength being the second wavelength, and emits light at, for example, approximately 530 nm. For example, the second light-emitting layer 3G includes a second light-emitting material that has a light emission central wavelength being the second wavelength and emits light at, for example, approximately 530 nm. The second light-emitting material emits light by, for example, recombination of an injected electron and an injected hole. In other words, it can be said that the second light-emitting layer 3G emits light by, for example, the recombination of the injected electron and the injected hole. Examples of the second light-emitting material include quantum dots and the like similar to the first light-emitting material. When the first light-emitting material and the second light-emitting material are quantum dot materials having the same composition, the second light-emitting material has a smaller diameter of the quantum dots and a wider band gap due to a quantum effect than the first light-emitting material. In general, when a diameter changes and a band gap changes in quantum dots of the same material, an energy level of a conduction band becomes shallow and a level of a valence band becomes deep, but the change in the level of the conduction band is greater than the change in the level of the valence band. Note that the second light-emitting material is selected as appropriate in accordance with an energy level of HOMO and an energy level of LUMO of each of the layers.

Further, the second light-emitting layer 3G has an energy level of LUMO higher than the energy level of LUMO of the first light-emitting layer 3R. In this way, for example, as illustrated in FIG. 6, the hole injected from the anode 5 can be more easily injected into the first light-emitting layer 3R via the second light-emitting layer 3G.

Note that, as described above, in the red light-emitting region 101R, the electron injected from the cathode 1R is blocked by the first electron blocking layer 4R disposed between the cathode 1R and the second light-emitting layer 3G, and thus the electron is unlikely to be injected into the second light-emitting layer 3G. Thus, in the second light-emitting layer 3G, the hole injected from the anode 5 and the electron injected from the cathode 1R are unlikely to be recombined, and almost no light is emitted.

The third light-emitting layer 3B is disposed between the anode 5 and the second light-emitting layer 3G. The third light-emitting layer 3B has a light emission central wavelength being the third wavelength, and emits light at, for example, approximately 440 nm. For example, the third light-emitting layer 3B includes a third light-emitting material that has a light emission central wavelength being the third wavelength and emits light at, for example, approximately 440 nm. The third light-emitting material emits light by, for example, recombination of an injected electron and an injected hole. In other words, it can be said that the third light-emitting layer 3B emits light by, for example, the recombination of the injected electron and the injected hole. Examples of the third light-emitting material include quantum dots and the like similar to the first light-emitting material. Note that the third light-emitting material is selected as appropriate in accordance with an energy level of HOMO and an energy level of LUMO of each of the layers.

Figure 7:
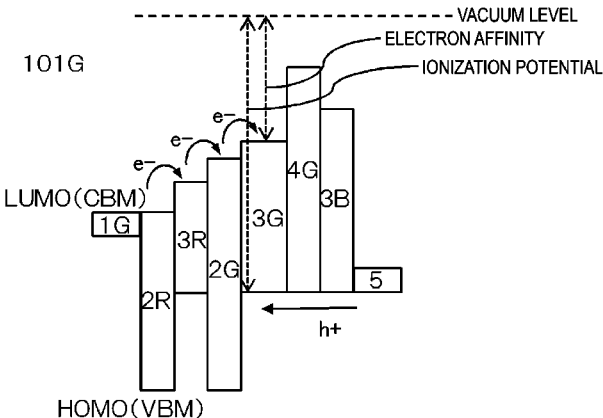
FIG. 7 is an energy level diagram of an example of each layer in a green light-emitting region of the light-emitting device according to the first embodiment.

Further, the third light-emitting layer 3B has an energy level of LUMO higher than the energy level of LUMO of the second light-emitting layer 3G. In this way, for example, as illustrated in FIG. 7, the hole injected from the anode 5 can be more easily injected into the first light-emitting layer 3R via the third light-emitting layer 3B, the second light-emitting layer 3G, and the first electron blocking layer 4R. Note that the third light-emitting layer 3B may be disposed in direct contact with the second light-emitting layer 3G.

Note that, in the red light-emitting region 101R, the electron injected from the cathode 1R is blocked by the first electron blocking layer 4R disposed between the cathode 1R and the third light-emitting layer 3B, and thus the electron is unlikely to be injected into the third light-emitting layer 3B. Thus, in the third light-emitting layer 3B, the hole injected from the anode 5 and the electron injected from the cathode 1R cannot be recombined, and almost no light is emitted.

As described above, in the red light-emitting region 101R, the first light-emitting layer 3R emits light, and the second light-emitting layer 3G and the third light-emitting layer 3B emit almost no light, and thus light is emitted at the light emission central wavelength being the first wavelength.

Subsequently, the green light-emitting region 101G will be described.

The green light-emitting region 101G is a region that emits green light in the light-emitting device 100A. The green light-emitting region 101G corresponds to, for example, a green light-emitting element in the light-emitting device 100A. The green light-emitting region 101G has a structure in which a cathode 1G, the second electron transport layer 2R, the first light-emitting layer 3R, a first electron transport layer 2G, the second light-emitting layer 3G, a second electron blocking layer 4G, a third light-emitting layer 3B, and the anode 5 are layered in this order. In other words, the green light-emitting region 101G has a structure in which each of the layers is disposed between the cathode 1G and the anode 5 disposed so as to face the cathode 1G. Note that the cathode 1G can inject an electron into the second light-emitting layer 3G, and the same material as that of the cathode 1R can be used for the cathode 1G.

Further, the green light-emitting region 101G has a configuration in which the cathode 1R is replaced with the cathode 1G, the first electron blocking layer 4R is not provided, the first electron transport layer 2G is disposed between the first light-emitting layer 3R and the second light-emitting layer 3G, and the second electron blocking layer 4G is further disposed between the second light-emitting layer 3G and the third light-emitting layer 3B in the configuration of the red light-emitting region 101R.

The first electron transport layer 2G transports, to the second light-emitting layer 3G, the electron injected from the cathode 1G. The first electron transport layer 2G has an energy level of LUMO located between the energy level of LUMO of the first light-emitting layer 3R and the energy level of LUMO of the second light-emitting layer 3G. In this way, for example, as illustrated in FIG. 7, the electron injected from the cathode 1G can be more easily injected into the second light-emitting layer 3G via the second electron transport layer 2R, the first light-emitting layer 3R, and the first electron transport layer 2G.

Furthermore, the first electron transport layer 2G preferably has an energy level of HOMO lower than an energy level of HOMO of the second light-emitting layer 3G described above. In this way, for example, as illustrated in FIG. 7, injection, into the first light-emitting layer 3R via the third light-emitting layer 3B, the second electron blocking layer 4G, and the second light-emitting layer 3G, of the hole injected from the anode 5 can be blocked. Furthermore, the hole injected from the anode 5 can be confined in the second light-emitting layer 3G, and thus luminous efficiency in the green light-emitting region 101G can be improved.

For example, as a material forming the first electron transport layer 2G, TPBi and $ZrO_2$ can be used in addition to a material similar to that of the second electron transport layer 2R described above. Note that the material forming the first electron transport layer 2G is selected as appropriate in accordance with an energy level of HOMO and an energy level of LUMO of each of the layers.

As described above, in the green light-emitting region 101G, the injection of the hole into the first light-emitting layer 3R is blocked by the first electron transport layer 2G, and thus the first light-emitting layer 3R emits almost no light.

The second electron blocking layer 4G is disposed between the third light-emitting layer 3B and the second light-emitting layer 3G. The second electron blocking layer 4G blocks injection, into the third light-emitting layer 3B side, of the electron injected from the cathode 1G.

The second electron blocking layer 4G preferably has an energy level of LUMO higher than the energy level of LUMO of the second light-emitting layer 3G. In this case, for example, as illustrated in FIG. 7, the injection, into the third light-emitting layer 3B side, of the electron injected from the cathode 1G via the second electron transport layer 2R, the first light-emitting layer 3R, the first electron transport layer 2G, and the second light-emitting layer 3G can be more easily blocked. Furthermore, the electron injected into the second light-emitting layer 3G can be confined in the second light-emitting layer 3G, and thus luminous efficiency in the green light-emitting region 101G can be improved.

Furthermore, the second electron blocking layer 4G preferably has an energy level of HOMO equal to or higher than the energy level of HOMO of the second light-emitting layer 3G. In this way, for example, as illustrated in FIG. 7, the hole injected from the anode 5 can be more easily injected into the second light-emitting layer 3G via the third light-emitting layer 3B and the second electron blocking layer 4G.

For example, a material similar to that of the first electron blocking layer 4R described above can be used as a material forming the second electron blocking layer 4G. Note that the material forming the second electron blocking layer 4G is selected as appropriate in accordance with an energy level of HOMO and an energy level of LUMO of each of the layers.

As described above, in the green light-emitting region 101G, the injection, into the third light-emitting layer 3B, of the electron injected from the cathode 1G is blocked by the second electron blocking layer 4G, and thus the third light-emitting layer 3B emits almost no light.

As described above, in the green light-emitting region 101G, the second light-emitting layer 3G emits light, and the first light-emitting layer 3R and the third light-emitting layer 3B emit almost no light, and thus light is emitted at the light emission central wavelength being the second wavelength.

Subsequently, the blue light-emitting region 101B will be described.

The blue light-emitting region 101B is a region that emits blue light in the light-emitting device 100A. The blue light-emitting region 101B corresponds to, for example, a blue light-emitting element in the light-emitting device 100A. The blue light-emitting region 101B has a structure in which a cathode 1B, the second electron transport layer 2R, the first light-emitting layer 3R, the first electron transport layer 2G, the second light-emitting layer 3G, a third electron transport layer 2B, the third light-emitting layer 3B, a third electron blocking layer 4B, and the anode 5 are layered in this order. In other words, the blue light-emitting region 101B has a structure in which each of the layers is disposed between the cathode 1B and the anode 5 disposed so as to face the cathode 1B. Note that the cathode 1B can inject an electron into the third light-emitting layer 3B, and the same material as that of the cathode 1R can be used for the cathode 1B. Further, the first light-emitting layer 3R and the second light-emitting layer 3G may be disposed in direct contact with each other.

Further, the blue light-emitting region 101B has a configuration in which the cathode 1G is replaced with cathode 1B, the second electron blocking layer 4G is not provided, the third electron transport layer 2B is disposed between the second light-emitting layer 3G and the third light-emitting layer 3B, and the third electron blocking layer 4B is further disposed between the third light-emitting layer 3B and the anode 5 in the configuration of the green light-emitting region 101G.

Figure 8:
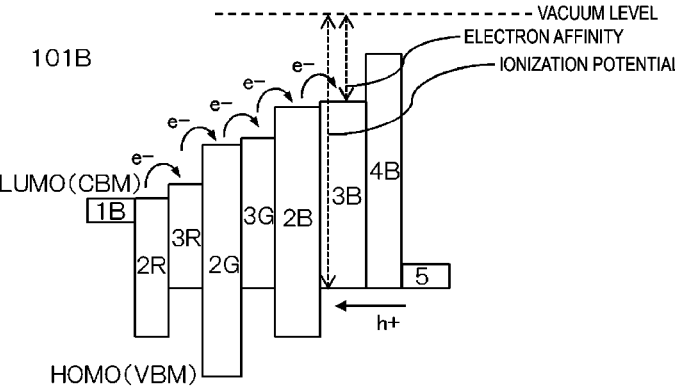
FIG. 8 is an energy level diagram of an example of each layer in a blue light-emitting region of the light-emitting device according to the first embodiment.

The third electron transport layer 2B transports, to the third light-emitting layer 3B, the electron injected from the cathode 1B. The third electron transport layer 2B has an energy level of LUMO located between the energy level of LUMO of the second light-emitting layer 3G and the energy level of LUMO of the third light-emitting layer 3B. In this way, for example, as illustrated in FIG. 8, the electron injected from the cathode 1B can be more easily injected into the third light-emitting layer 3B via the second electron transport layer 2R, the first light-emitting layer 3R, the first electron transport layer 2G, and the second light-emitting layer 3G.

Further, the third electron transport layer 2B preferably has an energy level of HOMO lower than an energy level of HOMO of the third light-emitting layer 3B. In this case, for example, as illustrated in FIG. 8, injection, into the second light-emitting layer 3G via the third electron blocking layer 4B and the third light-emitting layer 3B, of the hole injected from the anode 5 can be blocked. Furthermore, the hole injected from the anode 5 can be confined in the third light-emitting layer 3B, and thus luminous efficiency in the blue light-emitting region 101B can be improved.

For example, as a material forming the third electron transport layer 2B, Bphen and TAZ can be used in addition to a material similar to that of the first electron transport layer 2G described above. Note that the material forming the third electron transport layer 2B is selected as appropriate in accordance with an energy level of HOMO and an energy level of LUMO of each of the layers.

As described above, in the blue light-emitting region 101B, the injection of the hole into the second light-emitting layer 3G is blocked by the third electron transport layer 2B, and thus the second light-emitting layer 3G emits almost no light.

The third electron blocking layer 4B is disposed between the anode 5 and the third light-emitting layer 3B. The third electron blocking layer 4B blocks passage, through the third light-emitting layer 3B, of the electron injected from the cathode 1G. The third electron blocking layer 4B preferably has an energy level of LUMO higher than the energy level of LUMO of the third light-emitting layer 3B. In this case, for example, as illustrated in FIG. 8, the electron injected from the cathode 1B into the third light-emitting layer 3B via the second electron transport layer 2R, the first light-emitting layer 3R, the first electron transport layer 2G, the second light-emitting layer 3G, and the third electron transport layer 2B can be confined in the third light-emitting layer 3B, and thus luminous efficiency in the blue light-emitting region 101B can be improved.

The third electron blocking layer 4B preferably has an energy level of HOMO equal to or higher than the energy level of HOMO of the third light-emitting layer 3B. In this case, for example, as illustrated in FIG. 8, the hole injected from the anode 5 can be more easily injected into the third light-emitting layer 3B.

Note that the cathodes 1R, 1G, and 1B in the present embodiment preferably correspond to pixel electrodes of the light-emitting device 100A, and are preferably insulated from each other in the light-emitting regions. Then, the cathodes 1R, 1G, and 1B can be referred to as a first portion, a second portion, and a third portion of a cathode in the light-emitting device 100A. Furthermore, the anode 5 in the present embodiment corresponds to a common electrode of the light-emitting device 100A, and is formed in common among the light-emitting regions. Further, the configuration of the cathode and the anode in the present embodiment is not limited thereto, and, for example, the cathode may be the common electrode described above, and the anode may be the pixel electrode described above. Furthermore, the layering order of the layers in the present embodiment may be reversed.

Furthermore, in the light-emitting device in the present embodiment, for example, a substrate (not illustrated) may be disposed on a surface of the cathode 1 opposite to a surface on which the second electron transport layer 2R is disposed, in each of the light-emitting regions 101R, 101G, and 101B. The substrate is formed of, for example, glass or the like, and functions as a support body that supports each of the layers described above. The substrate may be an array substrate on which a thin film transistor (TFT) and the like are formed, for example.

In the light-emitting device 100A according to the present embodiment, particularly, in the blue light-emitting region 101B corresponding to the blue light-emitting region, an electron between the third light-emitting layer 3B and the cathode 1B can be injected into the third light-emitting layer 3B corresponding to a blue light-emitting layer having a wide band gap and having an electron injection barrier higher than the light-emitting layers of the other colors. In this way, particularly, luminous efficiency in the third light-emitting layer 3B can be improved, and light emission can be more easily balanced with the light-emitting regions of the other colors.

Figure 2:
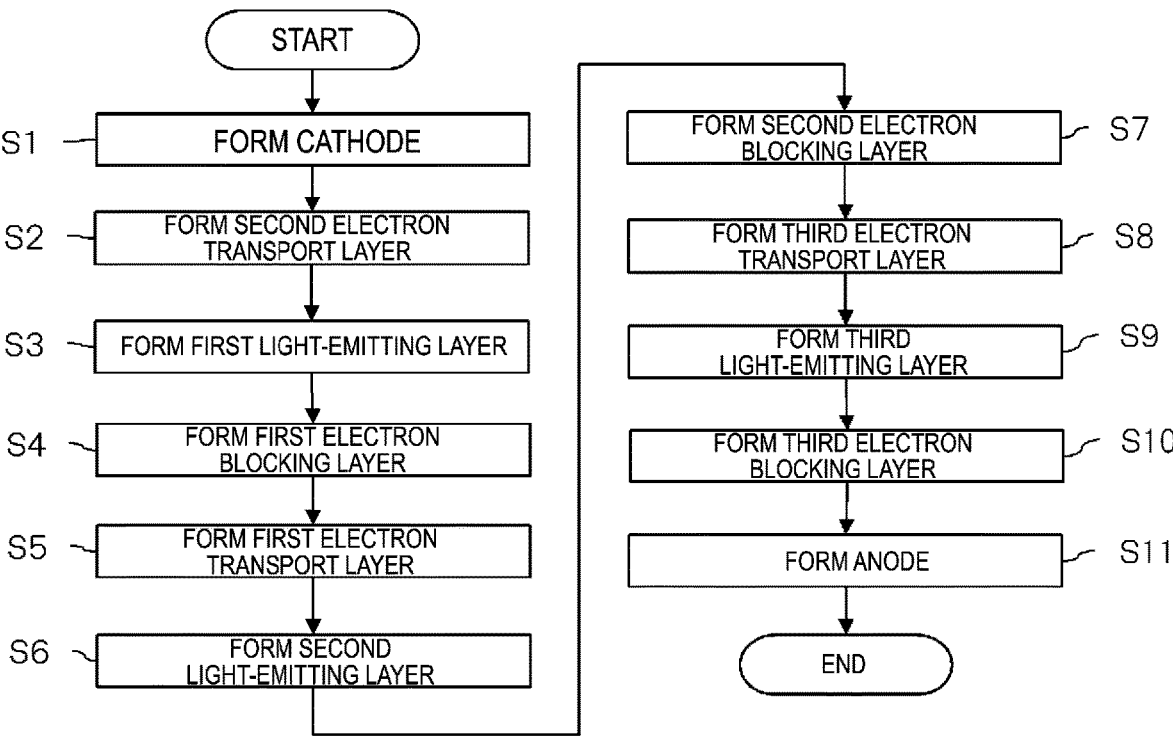
FIG. 2 is a diagram illustrating an example of a manufacturing flow of the light-emitting device according to the first embodiment.

Hereinafter, an example of a manufacturing method of the light-emitting device 100A according to the present embodiment will be described. FIG. 2 is a diagram illustrating an example of a manufacturing flow of the light-emitting device 100A.

First, as illustrated in FIG. 2, the cathodes 1R, 1G, and 1B are formed on a substrate (S1). The cathodes 1R, 1G, and 1B can be formed by, for example, forming a solid layer by various known methods in the related art such as sputtering and a vacuum vapor deposition technique and then performing patterning on the solid layer so as to remove a portion other than portions corresponding to the red light-emitting region 101R, the green light-emitting region 101G, and the blue light-emitting region 101B. Note that the cathodes 1R, 1G, and 1B may be formed so as to be insulated from each other by forming an insulating layer or the like, for example.

The second electron transport layer 2R is formed on the cathodes 1R, 1G, and 1B (S2). The second electron transport layer 2R can be formed by various known methods in the related art such as vacuum vapor deposition, sputtering, a transfer method, an ink-jet method, and an application method, for example. The second electron transport layer 2R in the present embodiment is common to the red light-emitting region 101R, the green light-emitting region 101G, and the blue light-emitting region 101B. Thus, the second electron transport layer 2R does not need to be formed for each of the light-emitting regions, and the number of manufacturing steps of the light-emitting device 100A can be reduced.

The first light-emitting layer 3R is formed on the second electron transport layer 2R (S3). The first light-emitting layer 3R can be formed by various known methods in the related art such as vacuum vapor deposition, sputtering, and an application method, for example. The first light-emitting layer 3R in the present embodiment is common to the red light-emitting region 101R, the green light-emitting region 101G, and the blue light-emitting region 101B. Thus, the first light-emitting layer 3R does not need to be formed for each of the light-emitting regions, and the number of manufacturing steps of the light-emitting device 100A can be reduced.

The first electron blocking layer 4R is formed on the first light-emitting layer 3R (S4). The first electron blocking layer 4R can be formed by, for example, forming a solid layer by various known methods in the related art such as vacuum vapor deposition, sputtering, a transfer method, an ink-jet method, and an application method and then performing patterning on the sold layer so as to leave a portion corresponding to the red light-emitting region 101R, that is, so as to remove portions corresponding to the green light-emitting region 101G and the blue light-emitting region 101B. Alternatively, by mask vapor deposition, a transfer method, an ink-jet method, or the like, the first electron blocking layer 4R can be selectively formed only in the portion corresponding to the red light-emitting region 101R, that is, can be selectively formed in a portion other than the portions corresponding to the green light-emitting region 101G and the blue light-emitting region 101B.

The first electron transport layer 2G is formed on the first light-emitting layer 3R on which the first electron blocking layer 4R in the red light-emitting region 101R is not formed in S4 (S5). The first electron transport layer 2G can be formed by, for example, forming a solid layer by various known methods in the related art such as vacuum vapor deposition, sputtering, and an application method and then performing patterning on the solid layer so as to leave portions corresponding to the green light-emitting region 101G and the blue light-emitting region 101B, that is, so as to remove a portion corresponding to the red light-emitting region 101R. Alternatively, by mask vapor deposition, a transfer method, an ink-jet method, or the like, the first electron transport layer 2G can be selectively formed only in the portions corresponding to the green light-emitting region 101G and the blue light-emitting region 101B, that is, can be selectively formed in a portion other than the portion corresponding to the red light-emitting region 101R.

In this way, in the first electron transport layer 2G, the portions corresponding to the green light-emitting region 101G and the blue light-emitting region 101B can be collectively formed, and thus the number of manufacturing steps of the light-emitting device 100A can be reduced. Note that the order of S4 and S5 may be switched.

The second light-emitting layer 3G is formed on the first electron blocking layer 4R and the first electron transport layer 2G (S6). For example, similarly to the first light-emitting layer 3R, the second light-emitting layer 3G can be formed by various known methods in the related art such as vacuum vapor deposition, sputtering, and an application method. The second light-emitting layer 3G in the present embodiment is common to the red light-emitting region 101R, the green light-emitting region 101G, and the blue light-emitting region 101B. Thus, the second light-emitting layer 3G does not need to be formed for each of the light-emitting regions, and the number of manufacturing steps of the light-emitting device 100A can be reduced.

The second electron blocking layer 4G is formed on the second light-emitting layer 3G (S7). The second electron blocking layer 4G can be formed by, for example, forming a solid layer by various known methods in the related art such as vacuum vapor deposition, sputtering, and an application method and then performing patterning on the solid layer so as to leave a portion corresponding to the green light-emitting region 101G, that is, so as to remove portions corresponding to the red light-emitting region 101R and the blue light-emitting region 101B. Alternatively, by mask vapor deposition, a transfer method, an ink-jet method, or the like, the second electron blocking layer 4G can be selectively formed only in the portion corresponding to the green light-emitting region 101G, that is, can be selectively formed in a portion other than the portions corresponding to the red light-emitting region 101R and the blue light-emitting region 101B.

The third electron transport layer 2B is formed on the second light-emitting layer 3G on which the second electron blocking layer 4G in the blue light-emitting region 101B is not formed in S7 (S8). The third electron transport layer 2B can be formed by, for example, forming a solid layer by various known methods in the related art such as vacuum vapor deposition, sputtering, and an application method and then performing patterning on the solid layer so as to leave a portion corresponding to the blue light-emitting region 101B, that is, so as to remove portions corresponding to the red light-emitting region 101R and the green light-emitting region 101G. Alternatively, by mask vapor deposition, a transfer method, an ink-jet method, or the like, the third electron transport layer 2B can be selectively formed only in the portion corresponding to the blue light-emitting region 101B, that is, can be selectively formed in a portion other than the portions corresponding to the red light-emitting region 101R and the green light-emitting region 101G. Note that the order of S7 and S8 may be switched.

The third light-emitting layer 3B is formed on the second light-emitting layer 3G in the red light-emitting region 101R, the second electron blocking layer 4G in the green light-emitting region 101G, and the third electron transport layer 2B in the blue light-emitting region 101B (S9). The third light-emitting layer 3B can be formed by various known methods in the related art such as vacuum vapor deposition, sputtering, and an application method, for example. The third light-emitting layer 3B in the present embodiment is common to the red light-emitting region 101R, the green light-emitting region 101G, and the blue light-emitting region 101B. Thus, the third light-emitting layer 3B does not need to be formed for each of the light-emitting regions, and the number of manufacturing steps of the light-emitting device 100A can be reduced.

The third electron blocking layer 4B is formed on the third light-emitting layer 3B (S10). The third electron blocking layer 4B can be formed by, for example, forming a solid layer by various known methods in the related art such as vacuum vapor deposition, sputtering, and an application method and then performing patterning on the solid layer so as to leave a portion corresponding to the blue light-emitting region 101B, that is, so as to remove portions corresponding to the red light-emitting region 101R and the green light-emitting region 101G. Alternatively, by mask vapor deposition, a transfer method, an ink-jet method, or the like, the third electron blocking layer 4B can be selectively formed only in the portion corresponding to the blue light-emitting region 101B, that is, can be selectively formed in a portion other than the portions corresponding to the red light-emitting region 101R and the green light-emitting region 101G.

The anode 5 is formed on the third light-emitting layer 3B in the red light-emitting region 101R and the green light-emitting region 101G, and the third electron blocking layer 4B in the blue light-emitting region 101B (S11). The anode 5 can be formed by various known methods in the related art such as vacuum vapor deposition, sputtering, and an application method, for example. The anode 5 in the present embodiment is common to the red light-emitting region 101R, the green light-emitting region 101G, and the blue light-emitting region 101B. Thus, the anode 5 does not need to be formed for each of the light-emitting regions, and the number of manufacturing steps of the light-emitting device 100A can be reduced.

In the above-described manner, the light-emitting device 100A can be manufactured.

Second Embodiment

Figure 3:
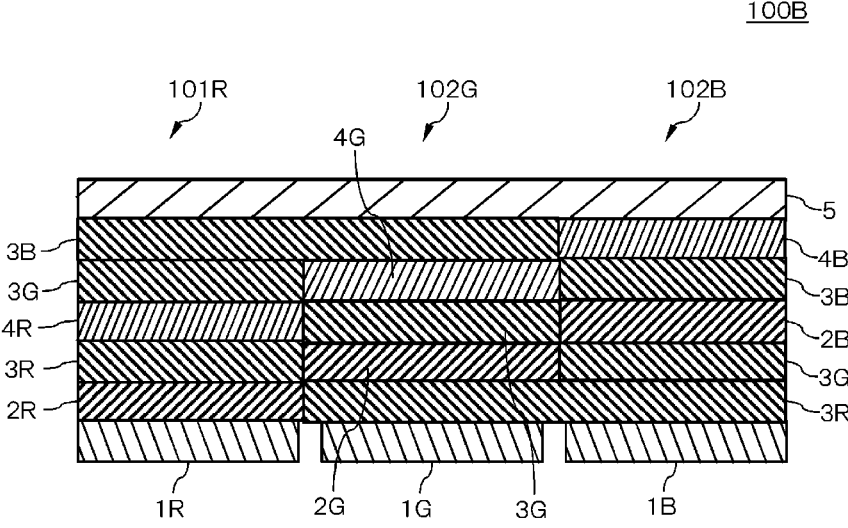
FIG. 3 is a diagram schematically illustrating an example of a layered structure of a light-emitting device according to a second embodiment.

FIG. 3 is a diagram schematically illustrating an example of a layered structure of a light-emitting device 100B according to the present embodiment.

The light-emitting device 100B according to the present embodiment has a configuration in which the second electron transport layer 2R is not formed in the green light-emitting region 101G, and the second electron transport layer 2R and the first electron transport layer 2G are not formed in the blue light-emitting region 101B in the light-emitting device in the first embodiment.

Note that, in the present embodiment, a second electron transport layer 2R can be formed by performing patterning on a second electron transport layer so as to remove portions corresponding to a green light-emitting region 102G and a blue light-emitting region 102B in S2 in the first embodiment.

Further, in the present embodiment, a first electron transport layer 2G can be formed by performing patterning so as to remove a portion corresponding to the blue light-emitting region 102B in addition to a portion corresponding to a red light-emitting region 101R in S5 in the first embodiment.

In the light-emitting device 100B in the present embodiment, the number of layers formed in the red light-emitting region 101R, the green light-emitting region 102G, and the blue light-emitting region 102B can be made equal. In this way, thicknesses of the red light-emitting region 101R, the green light-emitting region 102G, and the blue light-emitting region 102B are easily made uniform, an intensity of an electric field applied to a light-emitting layer in each of the light-emitting regions is easily made equal, and light emission intensity between the light-emitting regions is easily balanced.

Third Embodiment

Figure 4:
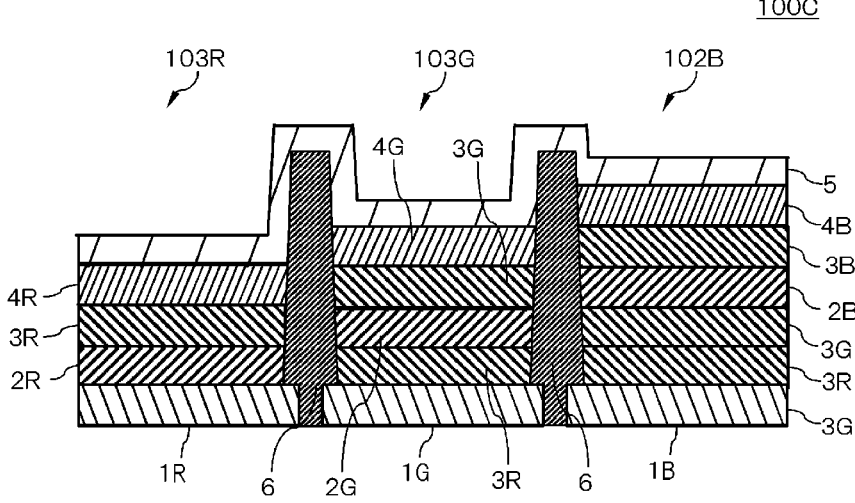
FIG. 4 is a diagram schematically illustrating an example of a layered structure of a light-emitting device according to a third embodiment.

FIG. 4 is a diagram schematically illustrating an example of a layered structure of a light-emitting device 100C according to the present embodiment.

The light-emitting device 100C according to the present embodiment has a configuration in which a bank 6 that partitions the red light-emitting region 101R, the green light-emitting region 101G, and the blue light-emitting region 101B is formed in the light-emitting device 100A in the first embodiment.

The bank 6 may be formed between S1 and S2 in the first embodiment. By providing the bank 6, an ink-jet method can be used when each layer is formed by using a solution and the like in S2 to S10 in the first embodiment. Further, since a red light-emitting region 103R, a green light-emitting region 103G, and a blue light-emitting region 102B are partitioned by the bank 6, color mixing in each of the regions can be suppressed.

Fourth Embodiment

Figure 5:
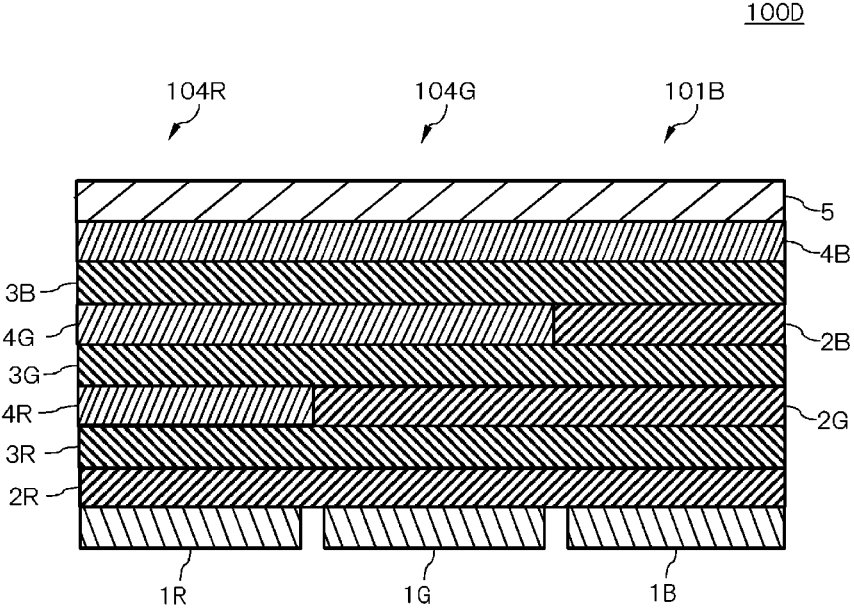
FIG. 5 is a diagram schematically illustrating an example of a layered structure of a light-emitting device according to a fourth embodiment.

FIG. 5 is a diagram schematically illustrating an example of a layered structure of a light-emitting device 100D according to the present embodiment.

The light-emitting device 100D according to the present embodiment has a configuration in which the second electron blocking layer 4G and the third electron blocking layer 4B are formed in the red light-emitting region 101R, and the third electron blocking layer 4B is formed in the green light-emitting region 101G in the light-emitting device in the first embodiment.

Note that, in the present embodiment, a second electron blocking layer 4G can be formed by performing patterning so as to leave a portion of a second electron blocking layer corresponding to a red light-emitting region 104R in addition to a portion of the second electron blocking layer corresponding to a green light-emitting region 104G in S7 in the first embodiment.

Further, in the present embodiment, for a third electron blocking layer 4B, a third electron blocking layer is not patterned in S10 in the first embodiment.

In the light-emitting device 100D in the present embodiment, the number of layers formed in the red light-emitting region 104R, the green light-emitting region 104G, and a blue light-emitting region 101B can be made equal. In this way, thicknesses in the red light-emitting region 104R, the green light-emitting region 104G, and the blue light-emitting region 101B are easily made uniform, and light emission intensities of the light-emitting regions are easily balanced.

The disclosure is not limited to the embodiments described above, and may be substituted with a configuration that is substantially the same as the configuration described in the embodiments described above, a configuration that achieves the same action and effect, or a configuration capable of achieving the same object.

Note that, in the embodiments described above, on an assumption that each of the layers is an organic material, comparison is performed in the height of an energy level of HOMO and an energy level of LUMO in each of the layers.

However, for example, as illustrated in FIGS. 6 to 8, when each of the layers is an inorganic crystal material, an energy level of HOMO and an energy level of LUMO in each of the layers can be replaced with an energy level of a conduction band minimum (CBM) and an energy level of a valence band maximum (VBM) in each of the layers, respectively. Furthermore, when the layers are formed using an organic material and an inorganic crystal material, an energy level of HOMO and an energy level of LUMO in each of the layers can be replaced with magnitude of an ionization potential and magnitude of an electron affinity in each of the layers, respectively.

In other words, magnitude of energy needed for extracting an electron from an energy level of LUMO in an organic material or an energy level of CBM in an inorganic crystal material is an electron affinity, and magnitude of energy needed for extracting an electron, to a vacuum level, from an energy level of HOMO in an organic material or an energy level of VBM in an inorganic crystal material is a value obtained by adding a band gap to an electron affinity, that is, an ionization potential.

The invention claimed is:

1. A light-emitting device comprising:
a first light-emitting region in which a light emission central wavelength is a first wavelength;
a second light-emitting region in which a light emission central wavelength is a second wavelength shorter than the first wavelength;
a cathode disposed in the first light-emitting region and the second light-emitting region;
an anode facing the cathode in the first light-emitting region and the second light-emitting region;
a first light-emitting layer disposed between the cathode and the anode, and having a light emission central wavelength being the first wavelength;
a second light-emitting layer disposed between the anode and the first light-emitting layer at least in the second light-emitting region, the second light-emitting layer having a light emission central wavelength being the second wavelength, and having an electron affinity lower than an electron affinity of the first light-emitting layer; and
a first electron transport layer disposed between the first light-emitting layer and the second light-emitting layer in the second light-emitting region, and having a magnitude of an electron affinity between the electron affinity of the first light-emitting layer and the electron affinity of the second light-emitting layer.

2. The light-emitting device according to claim 1,
wherein an ionization potential of the first electron transport layer is greater than an ionization potential of the second light-emitting layer.

3. The light-emitting device according to claim 1,
wherein the second light-emitting layer is also disposed in the first light-emitting region, and
the light-emitting device further comprises a first electron blocking layer disposed between the first light-emitting layer and the second light-emitting layer in the first light-emitting region, and having an electron affinity lower than the electron affinity of the second light-emitting layer.

4. The light-emitting device according to claim 3,
wherein an ionization potential of the first electron blocking layer is equal to or less than an ionization potential of the first light-emitting layer.

5. The light-emitting device according to claim 1, further comprising:

a second electron transport layer disposed between the cathode and the first light-emitting layer in the first light-emitting region, and having an electron affinity higher than the electron affinity of the first light-emitting layer.

6. The light-emitting device according to claim 5, wherein an ionization potential of the second electron transport layer is greater than an ionization potential of the first light-emitting layer.

7. The light-emitting device according to claim 1, wherein a number of layers disposed in the first light-emitting region and a number of layers disposed in the second light-emitting region are equal to each other.

8. The light-emitting device according to claim 1, further comprising:

a third light-emitting region in which a light emission central wavelength is a third wavelength shorter than the second wavelength;

a third light-emitting layer overlapping the second light-emitting layer between the cathode and the anode at least in the third light-emitting region, the third light-emitting layer having a light emission central wavelength being the third wavelength, and having an electron affinity lower than the electron affinity of the second light-emitting layer; and a third electron transport layer disposed between the second light-emitting layer and the third light-emitting layer in the third light-emitting region, and having a magnitude of an electron affinity between the electron affinity of the second light-emitting layer and the electron affinity of the third light-emitting layer, wherein the cathode and the second light-emitting layer are also disposed in the third light-emitting region.

9. The light-emitting device according to claim 8, wherein an ionization potential of the third electron transport layer is greater than an ionization potential of the third light-emitting layer.

10. The light-emitting device according to claim 8, wherein the third light-emitting layer is also disposed in the second light-emitting region, and the light-emitting device further comprises a second electron blocking layer disposed between the second light-emitting layer and the third light-emitting layer in the second light-emitting region, and having an electron affinity lower than the electron affinity of the third light-emitting layer.

11. The light-emitting device according to claim 10, wherein an ionization potential of the second electron blocking layer is equal to or less than an ionization potential of the second light-emitting layer.

12. The light-emitting device according to claim 8, further comprising:

a third electron blocking layer disposed between the anode and the third light-emitting layer in the third light-emitting region and having an electron affinity lower than the electron affinity of the third light-emitting layer.

13. The light-emitting device according to claim 12, wherein an ionization potential of the third electron blocking layer is equal to or less than an ionization potential of the third light-emitting layer.

14. The light-emitting device according to claim 10, wherein the third light-emitting layer is also disposed in the first light-emitting region, and the second light-emitting layer and the third light-emitting layer are in direct contact with each other and overlap each other in the first light-emitting region.

15. The light-emitting device according to claim 10, wherein the first light-emitting layer and the second light-emitting layer are in direct contact with each other and overlap each other in the third light-emitting region.

16. The light-emitting device according to claim 1, wherein at least one of the cathode and the anode includes:

a first portion located in the first light-emitting region, and a second portion located in the second light-emitting region and insulated from the first portion.

17. The light-emitting device according to claim 8, wherein a number of layers disposed in the first light-emitting region, a number of layers disposed in the second light-emitting region, and a number of layers disposed in the third light-emitting region are equal to one another.

* * * * *